United States Patent
Hsu et al.

(10) Patent No.: US 9,147,769 B2
(45) Date of Patent: Sep. 29, 2015

(54) THIN FILM TRANSISTOR HAVING SILICON-CONTAINING LIGHT ABSORPTION LAYER

(71) Applicant: E Ink Holdings Inc., Hsinchu (TW)

(72) Inventors: Cheng-Hang Hsu, Hsinchu (TW);
Tzung-Wei Yu, Hsinchu (TW);
Wei-Tsung Chen, Hsinchu (TW);
Ted-Hong Shinn, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 73 days.

(21) Appl. No.: 13/965,183

(22) Filed: Aug. 12, 2013

(65) Prior Publication Data
US 2014/0183521 A1 Jul. 3, 2014

(30) Foreign Application Priority Data
Dec. 27, 2012 (TW) .............................. 101150646 A

(51) Int. Cl.
*H01L 29/786* (2006.01)

(52) U.S. Cl.
CPC ...... *H01L 29/78633* (2013.01); *H01L 29/7869* (2013.01)

(58) Field of Classification Search
CPC .................... H01L 29/7869; H01L 29/78633; H01L 2251/53; H01L 2251/5346; H01L 2251/303
See application file for complete search history.

(56) References Cited

U.S. PATENT DOCUMENTS

| | | | |
|---|---|---|---|
| 4,796,072 A * | 1/1989 | Higashi et al. ............... | 257/444 |
| 5,780,858 A | 7/1998 | Waechter et al. | |
| 6,396,046 B1 | 5/2002 | Possin et al. | |
| 2004/0212759 A1* | 10/2004 | Hayashi ...................... | 349/84 |
| 2007/0178672 A1* | 8/2007 | Tanaka et al. ................ | 438/487 |
| 2010/0072435 A1* | 3/2010 | Honda et al. ............. | 252/519.51 |
| 2011/0263091 A1* | 10/2011 | Yamazaki ................... | 438/287 |
| 2012/0138932 A1 | 6/2012 | Lin et al. | |

FOREIGN PATENT DOCUMENTS

TW 201205846 2/2012

OTHER PUBLICATIONS

"Office Action of Taiwan Counterpart Application", issued on Apr. 15, 2015, p1-p6.

* cited by examiner

*Primary Examiner* — Thanh V Pham
(74) *Attorney, Agent, or Firm* — Jianq Chyun IP Office

(57) ABSTRACT

A thin film transistor structure including a substrate, a gate, an oxide semiconductor layer, a gate insulation layer, a source, a drain, a silicon-containing light absorption layer and an insulation layer is provided. The gate insulation layer is disposed between the oxide semiconductor layer and the gate. The oxide semiconductor layer and the gate are stacked in a thickness direction. The source and the drain contact the oxide semiconductor layer. A portion of the oxide semiconductor layer without contacting the source and the drain defines a channel region located between the source and the drain. The oxide semiconductor layer is located between the substrate and the silicon-containing light absorption layer. The silicon-containing light absorption layer has a band gap smaller than 2.5 eV. The insulation layer is disposed between the oxide semiconductor layer and the silicon-containing light absorption layer, and in contact with the silicon-containing light absorption layer.

12 Claims, 3 Drawing Sheets

THIN FILM TRANSISTOR HAVING SILICON-CONTAINING LIGHT ABSORPTION LAYER

CROSS-REFERENCE TO RELATED APPLICATION

This application claims the priority benefit of Taiwan application serial no. 101150646, filed on Dec. 27, 2012. The entirety of the above-mentioned patent application is hereby incorporated by reference herein and made a part of this specification.

BACKGROUND OF THE INVENTION

1. Field of the Invention

The present invention relates to a thin film transistor structure, and more particularly, to a thin film transistor structure having an oxide semiconductor layer.

2. Description of Related Art

Regarding a known thin film transistor array substrate, an amorphous silicon (a-Si) thin film transistor or a low temperature poly-crystalline silicon (LTPS) thin film transistor is commonly used as a switch for controlling the electronic signals. Recently, it is found that an oxide semiconductor thin film transistor has higher carrier mobility than the a-Si thin film transistor. Additionally, the oxide semiconductor thin film transistor has better threshold voltage (Vth) uniformity than the LTPS thin film transistor.

Regarding the known oxide semiconductor thin film transistor, the Vth of the oxide semiconductor channel layer would be shifted owing to a light irradiation so that the electric property and the reliability of the oxide semiconductor thin film transistor are affected. Therefore, how to improve the characteristic of the oxide semiconductor thin film transistor has become an important issue.

SUMMARY OF THE INVENTION

The present invention is directed to a thin film transistor structure having a desirable characteristic.

The invention provides a thin film transistor structure including a substrate, a gate, an oxide semiconductor layer, a gate insulation layer, a source, a drain, a silicon-containing light absorption layer and an insulation layer. The gate is disposed on the substrate. The oxide semiconductor layer is disposed on the substrate and stacked in a thickness direction with the gate. The gate insulation layer is disposed between the oxide semiconductor layer and the gate. The source is disposed on the substrate and in contact with the oxide semiconductor layer. The drain is disposed on the substrate and in contact with the oxide semiconductor layer. A portion of the oxide semiconductor layer without in contact with the source and the drain defines a channel region and the channel region is located between the source and the drain. The silicon-containing light absorption layer is stacked in the thickness direction with the oxide semiconductor layer and the oxide semiconductor layer is located between the substrate and the silicon-containing light absorption layer. The silicon-containing light absorption layer has a band gap smaller than 2.5 eV. The insulation layer is disposed between the oxide semiconductor layer and the silicon-containing light absorption layer, and the insulation layer is in contact with the silicon-containing light absorption layer.

In one embodiment of the present invention, the source and the drain are located between the insulation layer and the gate insulation layer. A material of the silicon-containing light absorption layer includes doped silicon. Herein, the insulation layer can have a contact window exposing the drain and the silicon-containing light absorption layer extends to cover the contact window and be in contact with the drain. The thin film transistor structure further includes a protection layer, wherein the gate, the oxide semiconductor layer, the gate insulation layer, the source, the drain, the insulation layer, and the silicon-containing light absorption layer are located between the substrate and the protection layer. In one instance, a dopant of the doped silicon includes boron, or phosphor.

In one embodiment of the present invention, the insulation layer and the silicon-containing light absorption layer substantially have a same shape.

In one embodiment of the present invention, the insulation layer is further in contact with the oxide semiconductor layer.

In one embodiment of the present invention, each of the source and the drain is partially located at a side of the silicon-containing light absorption layer, in which the side is away from the substrate.

In one embodiment of the present invention, a material of the silicon-containing light absorption layer includes amorphous silicon, poly-crystalline silicon, micro-crystalline silicon, crystalline silicon, or a combination thereof.

In one embodiment of the present invention, a material of the silicon-containing light absorption layer further includes hydrogen, oxygen, nitrogen, fluorine, carbon, or a combination thereof.

In one embodiment of the present invention, a material of the oxide semiconductor layer includes zinc oxide (ZnO), indium-gallium-zinc oxide (IGZO), gallium-zinc oxide (GZO), zinc-tin oxide (ZTO), indium-zinc oxide (IZO), or a combination thereof.

In one embodiment of the present invention, the source and the drain are located between the oxide semiconductor layer and the gate insulation layer.

In view of the above, a silicon-containing light absorption layer is configured at a side of the oxide semiconductor layer in the embodiments of the invention so that the light travels toward the oxide semiconductor layer can be shielded. Accordingly, the unfavorable characteristic of the thin film transistor structure caused by the light irradiation on the oxide semiconductor layer can be prevented.

In order to make the aforementioned and other features and advantages of the invention more comprehensible, embodiments accompanying figures are described in detail below.

DESCRIPTION OF EMBODIMENTS

Figure 1:
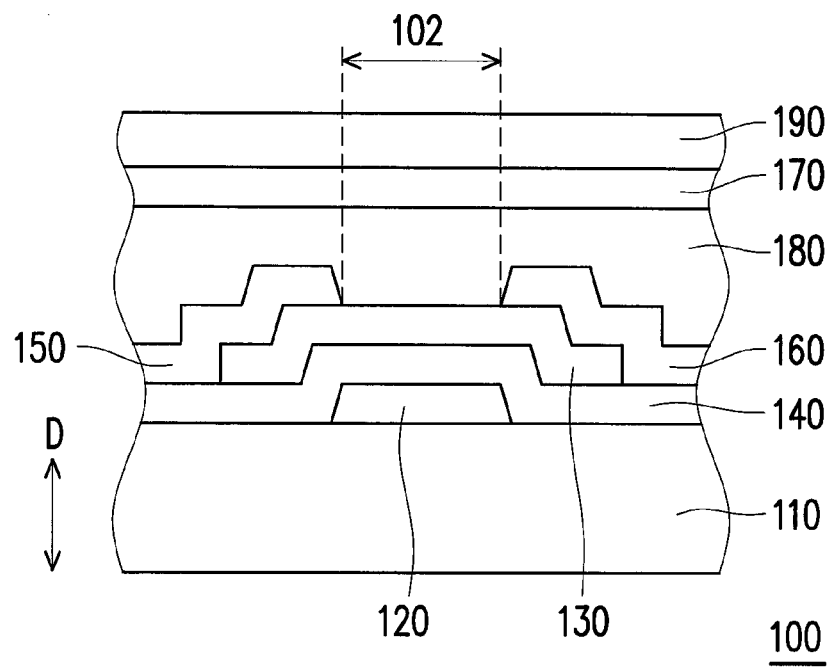
FIG. 1 is a schematic view of a thin film transistor structure according to a first embodiment of the present invention.

FIG. 1 is a schematic view of a thin film transistor structure according to a first embodiment of the present invention. Referring to FIG. 1, the thin film transistor structure 100 includes a substrate 110, a gate 120, an oxide semiconductor layer 130, a gate insulation layer 140, a source 150, a drain 160, a silicon-containing light absorption layer 170, an insulation layer 180 and a protection layer 190. The gate 120, the oxide semiconductor layer 130, the gate insulation layer 140, the source 150, the drain 160, the silicon-containing light absorption layer 170, the insulation layer 180 and the protection layer 190 are located at a same side of the substrate 110.

The gate 120 is disposed on the substrate 110. The gate insulation layer 140 covers the gate 120. Herein, the gate 120 is located between the gate insulation layer 140 and the substrate 110. The oxide semiconductor layer 130 is disposed on the gate insulation layer 140 and stacked in a thickness direction D with the gate 120. In other words, an area of the oxide semiconductor layer 130 projected on the substrate 110 along the thickness direction D is overlapped with an area of the gate 120 projected on the substrate 110 along the thickness direction D. Nevertheless, the gate 120 and the oxide semiconductor layer 130 are not in contact with each other and are separated from each other by the gate insulation layer 140.

The source 150 and the drain 160 are disposed on the oxide semiconductor layer 130 and are individually partially in contact with the oxide semiconductor layer 130. A portion of the oxide semiconductor layer 130 without in contact with the source 150 and the drain 160 defines a channel region 102 and the channel region 102 is located between the source 150 and the drain 160. Namely, the source 150 and the drain 160 are not physically connected to each other and are physically separated from each other.

The insulation layer 180 and the silicon-containing light absorption layer 170 are in contact with each other and are sequentially stacked above the source 150 and the drain 160. In the embodiment, the oxide semiconductor layer 130 is located between the substrate 110 and the silicon-containing light absorption layer 170. During the fabrication of the insulation layer 180 and the silicon-containing light absorption layer 170, an insulation material layer and a silicon-containing material layer can be sequentially deposited on the substrate 110, and the two material layers are subsequently patterned to have the required pattern in the same patterning process. Accordingly, the insulation layer 180 and the silicon-containing light absorption layer 170 substantially have a same shape. In the present embodiment, the protection layer 190 can cover on the silicon-containing light absorption layer 170, but the protection layer 190 can be omitted in other embodiments.

Regarding the materials, the gate 120, the source 150 and the drain 160 of the thin film transistor structure 100 can be made of the conductive materials including metal, metal alloy, conductive oxides, and the like. In one instance, the metal may include Cu, Mo, Al, Ag, etc., and the conductive oxide can include indium tin oxide (ITO), indium zinc oxide (IZO), or the like. The above-listed materials are only exemplary and not intended to limit the present invention. In other embodiments, any material having good conductivity can be used for fabricating the gate 120, the source 150 and the drain 160. A material for fabricating the gate insulation layer 140, the insulation layer 180 and the protection layer 190 includes an inorganic insulation material or an organic insulation material. The inorganic insulation material can include oxide, nitride, or oxynitride and the organic material can include polyimide, resin material or the like. In one instance, the oxide, the nitride, and the oxynitride can be respectively silicon oxide, silicon nitride, and silicon oxynitride.

In addition, a material of the oxide semiconductor layer 130 includes zinc oxide (ZnO), indium-gallium-zinc oxide (IGZO), gallium-zinc oxide (GZO), zinc-tin oxide (ZTO), indium-zinc oxide (IZO), or a combination thereof. The above oxide semiconductor material has higher carrier mobility than the a-Si semiconductor material so as to conduce to improve the characteristic of the thin film transistor structure 100.

Generally, an induced current can be generated in the oxide semiconductor layer 130 when the oxide semiconductor layer 130 is irradiated by a light, which is called the photo-current. The generation of the photo-current would negatively affect the characteristic of the device by causing a current leakage, for example. Therefore, in the present embodiment, the silicon-containing light absorption layer 170 is disposed above the oxide semiconductor layer 130. The silicon-containing light absorption layer 170 has a band gap smaller than 2.5 eV so as to absorb a green light or the light having shorter wavelength efficiently. Therefore, the light travelling toward the oxide semiconductor layer 130 can be mostly absorbed by the silicon-containing light absorption layer 170, which helps to restraining the irradiation of the light to the oxide semiconductor layer 130 and to avoiding the generation of the unfavorable current leakage.

In specific, a material of the silicon-containing light absorption layer 170 includes amorphous silicon, poly-crystalline silicon, micro-crystalline silicon, crystalline silicon, or a combination thereof. In other words, the silicon-containing light absorption layer 170 can be made of a silicon material having a particular crystalline structure. Commonly, the method of forming the silicon material can include a deposition process such as the vapor deposition process. During performing the deposition process, an extrinsic material can be added for modifying the property of the silicon-containing light absorption layer 170. Therefore, a material of the silicon-containing light absorption layer 170 can further includes hydrogen, oxygen, nitrogen, fluorine, carbon or a combination thereof, in addition to silicon. In one embodiment, a plasma enhanced chemical vapor deposition (PECVD) process can be adopted to fabricate the silicon-containing light absorption layer 170 and the material of the silicon-containing light absorption layer 170 can be hydrogenated amorphous silicon. The silicon-containing light absorption layer 170 then can have a band gap of about 1.75 eV. It is noted that the amount of the extrinsic material can be adjusted for the silicon-containing light absorption layer 170 having a band gap of a value from 1.7 eV to 2.5 eV to provide a desirable light absorption property. Specifically, the band gap of the silicon-containing light absorption layer 170 is not diminished without a limitation, but substantially greater than 1.1 eV which is equivalent to the band gap of single crystalline silicon.

In the present embodiment, the silicon-containing light absorption layer 170 is not in contact with the source 150 and the drain 160 by interposing the insulation layer 180. Therefore, in some embodiments, the silicon-containing light absorption layer 170 can have conductive property. In such embodiment, the material of the silicon-containing light absorption layer 170 can be doped silicon and the dopant thereof can be boron or phosphor. In the case that the silicon-containing light absorption layer 170 has the conductive property, the silicon-containing light absorption layer 170 can provide the electric shielding effect so as to prevent from the interference of the exterior electric signal on the thin film transistor structure 100. It is for sure that the present invention should not be construed as limited to the embodiments of the present invention.

Figure 2:
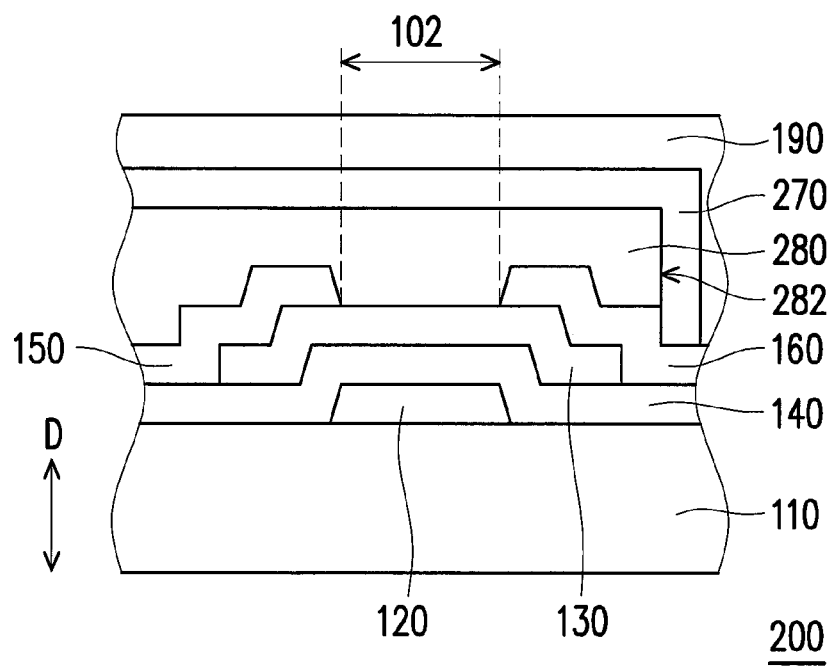
FIG. 2 is a schematic view of a thin film transistor structure according to a second embodiment of the present invention.

FIG. 2 is a schematic view of a thin film transistor structure according to a second embodiment of the present invention. Referring to FIG. 2, a thin film transistor structure 200 is similar to the thin film transistor structure 100 so that the same or similar components in the two embodiments are denoted by the same or similar reference numbers. In the present embodiment, the thin film transistor structure 200 includes a substrate 110, a gate 120, an oxide semiconductor layer 130, a gate insulation layer 140, a source 150, a drain 160, a silicon-containing light absorption layer 270, an insulation layer 280 and a protection layer 190. The dispositions, the materials and the properties of the substrate 110, the gate 120, the oxide semiconductor layer 130, the gate insulation layer 140, the source 150, the drain 160, and the protection layer 190 can be referred to the above embodiment and are not reiterated.

In the present embodiment, the silicon-containing light absorption layer 270 has the conductive property and the insulation layer 280 has a contact window 282 exposing the drain 160. The silicon-containing light absorption layer 270 extends to cover the contact window 282 so as to be in contact with the drains 160. Therefore, the silicon-containing light absorption layer 270 can not only shield the light for preventing from the unnecessary photo-current generated in the oxide semiconductor layer 130, but also be used as a conductive component transmitting the electronic signal outwardly from the thin film transistor structure 200. For applying in a display pixel, the silicon-containing light absorption layer 270 can be served as a pixel electrode or a conductive component connected to the pixel electrode.

Figure 3:
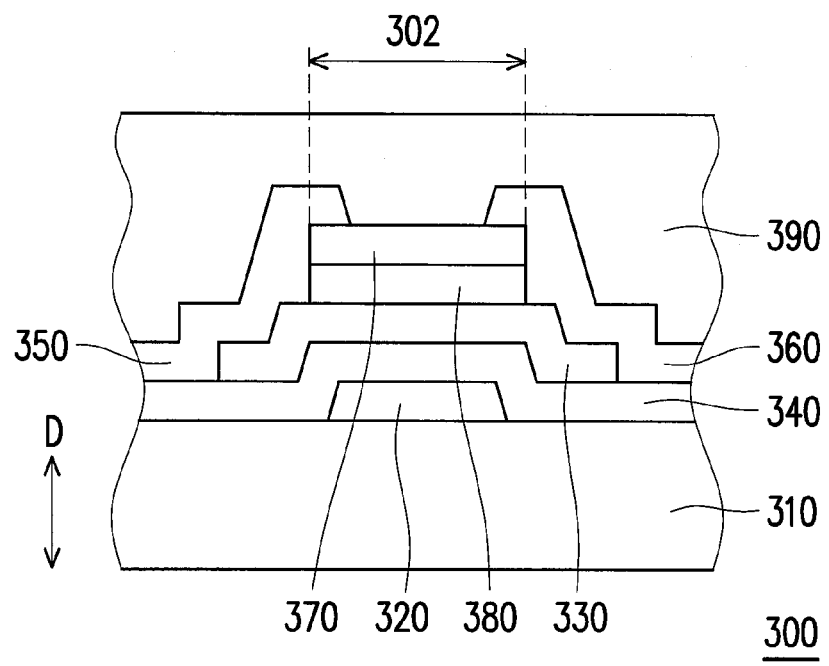
FIG. 3 is a schematic view of a thin film transistor structure according to a third embodiment of the present invention.

FIG. 3 is a schematic view of a thin film transistor structure according to a third embodiment of the present invention. Referring to FIG. 3, the thin film transistor 300 includes a substrate 310, a gate 320, an oxide semiconductor layer 330, a gate insulation layer 340, a source 350, a drain 360, a silicon-containing light absorption layer 370, an insulation layer 380 and a protection layer 390. The gate 320, the oxide semiconductor layer 330, the gate insulation layer 340, the source 350, the drain 360, the silicon-containing light absorption layer 370, the insulation layer 380 and the protection layer 390 are located at a same side of the substrate 310.

In the present embodiment, the gate 320, the gate insulation layer 340 and the oxide semiconductor layer 330 are sequentially stacked over the substrate 310. Thus, the gate 320 is located between the oxide semiconductor layer 330 and the substrate 310, and the gate insulation layer 340 is located between the gate 320 and the oxide semiconductor layer 330. In addition, in the present embodiment, the gate 320 and the oxide semiconductor layer 330 are stacked in the thickness direction D so that an area of the gate 320 projected on the substrate 310 along the thickness direction D is overlapped with an area of the oxide semiconductor layer 330 projected on the substrate 310 along the thickness direction D.

The source 350 and the drain 360 are disposed above the gate insulation layer 340, and the oxide semiconductor layer 330. Specifically, the source 350 and the drain 360 are separated from each other and are partially in contact with the oxide semiconductor layer 330. A portion of the oxide semiconductor layer 330 without in contact with the source 350 and the drain 360 defines a channel region 302 located between the source 350 and the drain 360. The gate 320 is at least located within the channel region 302.

The insulation layer 380 and the silicon-containing light absorption layer 370 are in contact with each other and are sequentially stacked above the oxide semiconductor layer 330. Furthermore, the protection layer 390 covers the source 350, the drain 360 and the silicon-containing light absorption layer 370 so that the gate 320, the oxide semiconductor layer 330, the gate insulation layer 340, the source 350, the drain 360, the silicon-containing light absorption layer 370 and the insulation layer 380 are located between the substrate 310 and the protection layer 390.

In the present embodiment, the insulation layer 380 and the silicon-containing light absorption layer 370 are substantially located within the channel region 302, and the source 350 and the drain 360 each has a portion covering on the silicon-containing light absorption layer 370. During the fabrication of the thin film transistor structure 300, the insulation layer 380 and the silicon-containing light absorption layer 370 can be formed over the oxide semiconductor layer 330. After the insulation layer 380 and the silicon-containing light absorption layer 370 are patterned into the required pattern, a conductive material layer can be formed on the oxide semiconductor layer 330 and the silicon-containing light absorption layer 370. Thereafter, the conductive material layer is patterned to form the source 350 and the drain 360. During patterning the conductive material layer, the insulation layer 380 and the silicon-containing light absorption layer 370 can be served as an etching stop layer so that the oxide semiconductor layer 330 located within the channel region 302 is prevented from being etched or contaminated by the impurities generated in the etching process.

Similar to the above embodiment, the gate 320, the source 350 and the drain 360 of the thin film transistor structure 300 can be made of the conductive materials including metal, metal alloy, conductive oxides, and the like. A material for fabricating the gate insulation layer 340, the insulation layer 380 and the protection layer 390 includes an inorganic or an organic insulation material. The inorganic insulation material can include oxide, nitride, or oxynitride and the organic material can include polyimide, resin material or the like.

In addition, a material of the oxide semiconductor layer 330 includes zinc oxide (ZnO), indium-gallium-zinc oxide (IGZO), gallium-zinc oxide (GZO), zinc-tin oxide (ZTO), indium-zinc oxide (IZO), or a combination thereof. In specific, a material of the silicon-containing light absorption layer 370 includes amorphous silicon, poly-crystalline silicon, micro-crystalline silicon, crystalline silicon, or a combination thereof. According to different fabrication conditions, a material of the silicon-containing light absorption layer 370 further selectively includes hydrogen, oxygen, nitrogen, fluorine, carbon, or a combination thereof.

In this embodiment, the silicon-containing light absorption layer 370 has a band gap smaller than 2.5 eV so as to absorb a green light or the light having shorter wavelength efficiently. The silicon-containing light absorption layer 370 is disposed above the oxide semiconductor layer 330 so that the light travelling toward the oxide semiconductor layer 330 can be mostly absorbed by the silicon-containing light absorption layer 370, which helps to restraining the irradiation of the light to the oxide semiconductor layer 330 and to avoiding the generation of the unfavorable current leakage. Furthermore, the silicon-containing light absorption layer 370 according to the present embodiment is in contact with the source 350 and the drain 360 so that the silicon-containing light absorption layer 370 does not have a conductive dopant, which avoids the electric connection between the source 350 and the drain 360 via the silicon-containing light absorption layer 370.

In the present embodiment, the insulation layer 380 and the silicon-containing light absorption layer 370 can be fabricated through a same patterning process. Accordingly, the insulation layer 380 and the silicon-containing light absorption layer 370 substantially have a same shape. It is for sure that the present invention should not be construed as limited to the embodiments of the present invention.

Figure 4:
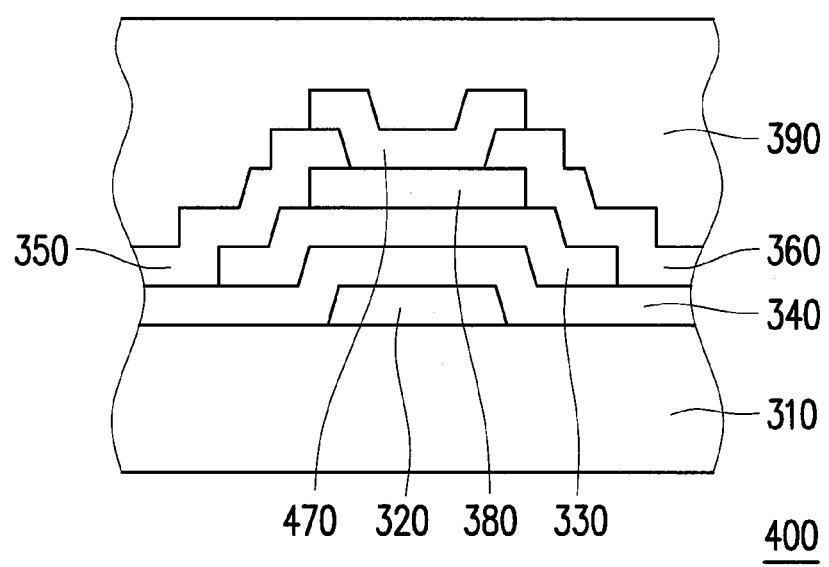
FIG. 4 is a schematic view of a thin film transistor structure according to a fourth embodiment of the present invention.

FIG. 4 is a schematic view of a thin film transistor structure according to a fourth embodiment of the present invention. Referring to FIG. 4, a thin film transistor structure 400 is similar to the thin film transistor structure 300 so that the same or similar components in the present and the third embodiments are denoted by the same or similar reference numbers. Specifically, the difference between the present embodiment and the third embodiment mainly lies in that the silicon-containing light absorption layer 470 covers a portion of the source 350 and a portion of the drain 360 in the present embodiment.

During fabricating the thin film transistor structure 400, the silicon-containing light absorption layer 470 is formed on the substrate 310 after the source 350 and the drain 360 are fabricated. Therefore, the insulation layer 380 can be served as the etching stop layer and the silicon-containing light absorption layer 470 can provide the light absorbing function. In addition, the silicon-containing light absorption layer 470 of the present embodiment is in contact with the source 350 and the drain 360 so that the silicon-containing light absorption layer 470 does not include a conductive dopant.

Figure 5:
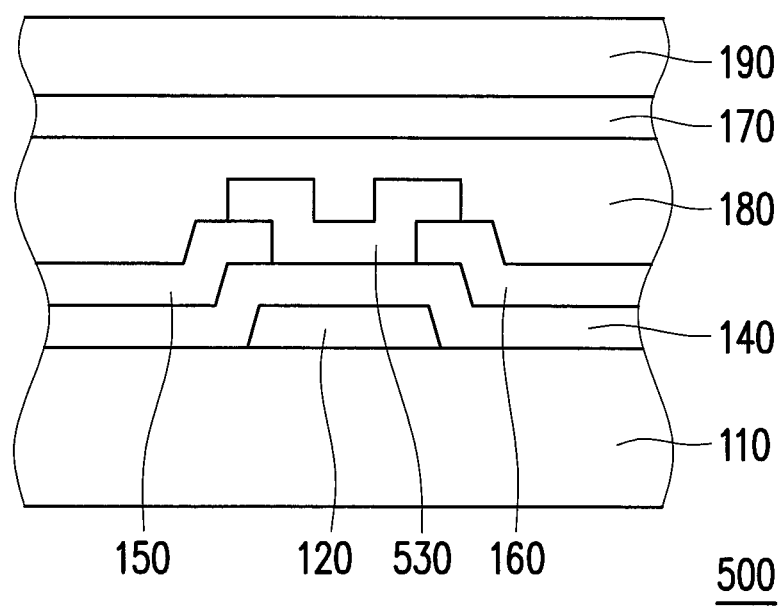
FIG. 5 is a schematic view of a thin film transistor structure according to a fifth embodiment of the present invention.

FIG. 5 is a schematic view of a thin film transistor structure according to a fifth embodiment of the present invention. Referring to FIG. 5, a thin film transistor structure 500 is similar to the thin film transistor structure 100 so that the same or similar components in the two embodiments are denoted by the same or similar reference numbers. Specifically, the difference between the two embodiments mainly lies in that the oxide semiconductor layer 530 is located above the source 150 and the drain 160 in the present embodiment. Accordingly, each of the source 150 and the drain 160 has a portion located between the oxide semiconductor layer 530 and the gate insulation layer 140. In the present embodiment, the silicon-containing light absorption layer 170 having a band gap smaller than 2.5 eV is configured over the oxide semiconductor layer 530, such that the unfavorable photo-current is not liable to be generated in the oxide semiconductor layer 530 and thus the characteristic of the thin film transistor structure 500 is improved. According to another embodiment, the thin film transistor structure 500 can be modified to have the design similar to the thin film transistor structure 200 so that the silicon-containing light absorption layer 170 is physically in contact with the drain 160.

In light of the foregoing, the thin film transistor structure according to the embodiments of the invention is configured with a silicon-containing light absorption layer above the oxide semiconductor layer, in which the silicon-containing light absorption layer is capable of absorbing the energy of the light. Therefore, the photo-current caused by the irradiation of the light is not liable to be generated in the oxide semiconductor layer, which helps the improvement of the characteristic of the thin film transistor structure. In addition, according to some embodiments of the invention, the silicon-containing light absorption layer and the insulation layer can be patterned into the required pattern through the same patterning process, such that the additional configuration of the silicon-containing light absorption layer would not complicate the fabrication process of the thin film transistor structure. In the case that the silicon-containing light absorption layer is fabricated through the same patterning process, the shapes of the silicon-containing light absorption layer and the insulation layer can be substantially the same.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A thin film transistor structure, comprising:
   a substrate;
   a gate disposed on the substrate;
   an oxide semiconductor layer disposed on the substrate, wherein the oxide semiconductor layer and the gate being stacked in a thickness direction;
   a gate insulation layer disposed between the oxide semiconductor layer and the gate;
   a source disposed on the substrate and in contact with the oxide semiconductor layer;
   a drain disposed on the substrate and in contact with the oxide semiconductor layer, wherein a portion of the oxide semiconductor layer without in contact with the source and the drain defines a channel region and the channel region is located between the source and the drain;
   a silicon-containing light absorption layer stacked in the thickness direction with the oxide semiconductor layer and the oxide semiconductor layer being located between the substrate and the silicon-containing light absorption layer, wherein the silicon-containing light absorption layer has a band gap smaller than 2.5 eV; and
   an insulation layer disposed between the oxide semiconductor layer and the silicon-containing light absorption layer, and the insulation layer being in contact with the silicon-containing light absorption layer, wherein the insulation layer has a contact window exposing the drain and the silicon-containing light absorption layer extends to cover the contact window and is in contact with the drain.

2. The thin film transistor structure according to claim 1, wherein the source and the drain are located between the insulation layer and the gate insulation layer.

3. The thin film transistor structure according to claim 2, wherein a material of the silicon-containing light absorption layer comprises a doped-silicon.

4. The thin film transistor structure according to claim 1, further comprising a protection layer, wherein the gate, the oxide semiconductor layer, the gate insulation layer, the source, the drain, the insulation layer, and the silicon-containing light absorption layer are located between the substrate and the protection layer.

5. The thin film transistor structure according to claim 3, wherein a dopant of the doped-silicon comprises boron or phosphor.

6. The thin film transistor structure according to claim 1, wherein the insulation layer and the silicon-containing light absorption layer substantially have a same shape.

7. The thin film transistor structure according to claim 1, wherein the insulation layer is further in contact with the oxide semiconductor layer.

8. The thin film transistor structure according to claim 1, wherein each of the source and the drain is partially located at a side of the silicon-containing light absorption layer, in which the side is away from the substrate.

9. The thin film transistor structure according to claim 1, wherein a material of the silicon-containing light absorption layer comprises an amorphous silicon, a poly-crystalline silicon, a micro-crystalline silicon, a crystalline silicon, or a combination thereof.

10. The thin film transistor structure according to claim 1, wherein a material of the silicon-containing light absorption layer further comprises hydrogen, oxygen, nitrogen, fluorine, carbon, or a combination thereof.

11. The thin film transistor structure according to claim 1, wherein a material of the oxide semiconductor layer comprises zinc oxide (ZnO), indium-gallium-zinc oxide (IGZO), gallium-zinc oxide (GZO), zinc-tin oxide (ZTO), indium-zinc oxide (IZO), or a combination thereof.

12. The thin film transistor structure according to claim 1, wherein the source and the drain are located between the oxide semiconductor layer and the gate insulation layer.

* * * * *